United States Patent [19]
Groman et al.

[11] Patent Number: 5,686,226
[45] Date of Patent: Nov. 11, 1997

[54] METHOD OF FORMING AN APPLICATOR FOR APPLYING TACKING MEDIA TO A CIRCUIT SUBSTRATE

[75] Inventors: Barry B. Groman, Margate; Anthony B. Suppelsa, Coral Springs; Scott Potter, Coconut Creek, all of Fla.

[73] Assignee: Motorola, Inc., Schaumburg, Ill.

[21] Appl. No.: 511,077

[22] Filed: Aug. 3, 1995

[51] Int. Cl.⁶ ........................................... G03F 7/26
[52] U.S. Cl. ..................... 430/325; 430/327; 430/328; 228/35
[58] Field of Search ............................... 228/35; 430/325, 430/328, 327

[56] References Cited

U.S. PATENT DOCUMENTS

| | | | |
|---|---|---|---|
| 3,034,478 | 5/1962 | Schwartz. | |
| 4,239,576 | 12/1980 | Take et al. | 156/297 |
| 5,164,022 | 11/1992 | Pine et al. | 148/23 |
| 5,177,134 | 1/1993 | Mullen et al. | 524/284 |
| 5,215,859 | 6/1993 | Martens | 430/328 |
| 5,232,736 | 8/1993 | Tribbey et al. | 427/8 |
| 5,300,403 | 4/1994 | Angelopolus | 430/328 |
| 5,372,294 | 12/1994 | Gore et al. | 228/105 |

*Primary Examiner*—Christopher G. Young
*Attorney, Agent, or Firm*—Andrew S. Fuller

[57] ABSTRACT

An applicator (300) provides a tool for depositing processing media (510), such as a tacky flux agent, on predetermined surface areas (715) of a circuit substrate (705). The applicator (300) has a portion formed from a flexible compressible material with a surface (302, 325) patterned to have projections (325) that correspond in location to the predetermined surface areas (715) of the circuit substrate (705). The applicator (300) is preferably formed by polymerizing resin material using an image that corresponds to the circuit substrate (410, 420, 430).

9 Claims, 3 Drawing Sheets

5,686,226

METHOD OF FORMING AN APPLICATOR FOR APPLYING TACKING MEDIA TO A CIRCUIT SUBSTRATE

TECHNICAL FIELD

This invention relates in general to the manufacturing of circuit carrying substrates, and more particularly to the application of processing media such as flux, or tacky media to a circuit substrate.

BACKGROUND OF THE INVENTION

In the manufacture of electronic products, many manufacturing operations involve the assembly of discrete electrical and mechanical components to a circuit substrate. In a typical case, the circuit substrate is prepared by placing solder deposits at locations at which components are to be mounted. Component placement machines then select and properly orient the components on the circuit substrate. Ordinarily, the components are temporarily secured to the circuit substrate using a flux material or other tacky medium. The solder is then reflowed to more permanently secure the components to the circuit substrate.

There are many prior art methods available for applying tacky medium, such as flux, to a circuit substrate. For example, the entire surface of the circuit substrate may be coated by the flux material by brushing, spraying, or roller coating, or by dipping the circuit substrate within the flux material. Obvious problems to this approach include the necessity for a cleaning process for removing unwanted flux material from the circuit substrate. In applications involving very small electronic components, this approach may not be practical because the surface tension of the flux material may tend to pull the components out of position when placed.

Another approach to the application of flux to a circuit substrate involves a screen printing method similar to that commonly used to apply solder paste to circuit substrates. This typically requires the manufacture of a stencil with holes corresponding to the desired location of the flux material on the circuit substrate. Screen printing has inherent problems including being difficult to automate, particularly when various configurations of circuit substrates must be manufactured. Moreover, a screen printing process usually requires a large investment in cleaning and maintenance operations.

A prior art solution providing much flexibility involves the use of a positive displacement pump for dispensing flux material. In this approach, the flux material is forced through a needle like apparatus which is successively placed at locations at which flux material is desired. This approach is susceptible to two major problems. First, air bubbles may get trapped in the dispensing reservoir and be expelled from the needle apparatus at a point where flux material should be dispensed, thereby causing a potential defect in the manufacturing process. Second, this approach is typically time consuming in that the dispensing apparatus must be moved from location to location until material is dispensed at the necessary locations on the circuit substrate.

To substantially speed up the flux dispensing process, the prior art teaches a pin transfer approach in which an array of pins is arranged in a configuration corresponding to the locations on the circuit substrate at which flux material is to be dispensed. This array of pins is then partially immersed in flux material and then transferred over to the circuit substrate at which point the flux material on the pins is deposited on the circuit substrate. Such a method is described in U.S. Pat. No. 5,435,431, issued to Alves, et al, on Jul. 25, 1995, for A SOLDERING PROCESS. Drawbacks to the use of a pin transfer method include the expense in manufacturing the pin transfer tool, and the fragility of the pins themselves when used in a manufacturing operation.

There are several methods available in the prior art for transferring flux or other tacking media to a circuit substrate. However, many of these approaches have inherent problems that make them not well suited for some manufacturing operations. In any event, these approaches have drawbacks that must be accommodated. It is desirable to provide a method and apparatus for the application of circuit substrate processing media, such as flux, or tacking medium, which do not have the problems associated with the approaches described for the prior art.

DETAILED DESCRIPTION OF THE PREFERRED EMBODIMENT

Figure 1:
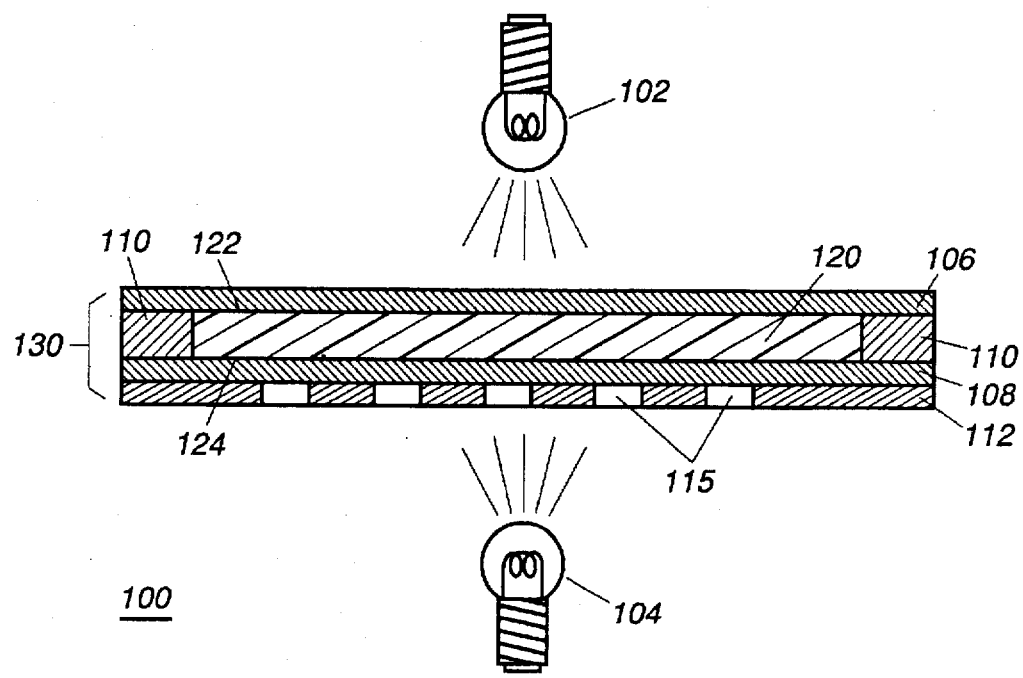
FIG. 1 is a cross-sectional view of an assembly for manufacturing an applicator, in accordance with the present invention.

While the specification concludes with claims defining the features of the invention that are regarded as novel, it is believed that the invention will be better understood from a consideration of the following description in conjunction with the drawing figures, in which like reference numerals are carried forward.

Generally, the present invention provides a method and apparatus for application of a circuit substrate processing media, such as tacky flux material, to a circuit substrate. The present invention provides a method for forming the applicator, and for using the applicator to apply circuit substrate processing media. Preferably, the applicator is formed by exposing unpolymerized resin to radiation through a substrate having a negative image. The negative image defines radiation transparent portions corresponding to surface areas of the circuit substrate which are designated to receive circuit substrate processing media. After exposure, the resin is polymerized to form a flexible compressible material with a surface patterned with projections that correspond in location to the predetermined surface areas of the circuit substrate. The applicator is then used to engage the circuit substrate processing medium with at least a portion of the projections. The circuit substrate processing medium adhered to the projections is then deposited onto corresponding surface areas of the circuit substrate.

Referring now to FIG. 1, an applicator manufacturing assembly 100 is shown, in accordance with the present invention. Preferably, the applicator is formed from unpolymerized resin material, that when polymerized, forms a compressible flexible resin material. In the preferred embodiment, an applicator based material 120 is provided which comprises unpolymerized resin, available in a liqueous state, which becomes polymerized when exposed to ultraviolet radiation. The applicator base material 120 is placed or disposed between first and second substrates 106, 108 which are permeable or transparent to ultraviolet radiation. The substrate 106, 108 are separated by spacers 110. A substrate 112 having a negative photo-image is interfaced with the second transparent substrate 108. The negative photo-image defines radiation transparent portions 115, i.e., these portions of the substrate are permeable or transparent to ultra violet light, whereas other portions of the substrate are not. The first and second transparent substrates 106, 108, the spacers 110, and the negative image substrate 112, form a radiation transparent frame 130 that confines the resin 120, and provides the resin with first and second opposing surfaces, 122, 124. The applicator manufacturing assembly 100 also includes first and second ultraviolet radiation sources 102, 104, which are disposed adjacent to the radiation transparent frame 130.

Preferably, the negative image substrate is formed by retrieving or deriving data from a computer assisted design (CAD) database that defines the structure of a circuit substrate on which tacky flux media is to be disposed. The data corresponding to the circuit substrate preferably defines the surface areas on the circuit substrate at which tacky flux media is to be disposed. A photo-negative image is formed on a substrate so as to define the radiation transparent portions 115. The photo-negative image can be formed by photo-plotting or laser plotting onto a Mylar film or photographic film.

In a preferred method of construction, the first surface 122 of the applicator base material 120 is flood exposed with the ultraviolet radiation source 102 to generate a relatively flat portion of polymerized resin. Note that only a portion of the applicator base material 120 is polymerized. The second surface 124 of the applicator base material 120 is then exposed to the radiation source 104 through the radiation transparent portions 115 of the negative image substrate 112 such that only portions of the applicator base material 120 at the second surface 124 are exposed to ultraviolet radiation.

Figure 2:
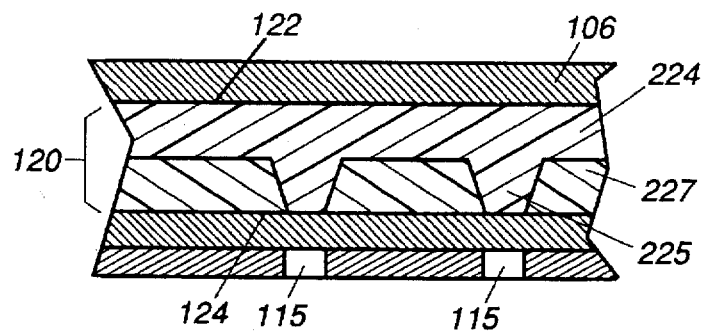
FIG. 2 is a fragmentary cross-sectional view of the applicator manufacturing assembly, showing the applicator in a partial state of construction, in accordance with the present invention.

FIG. 2 shows the state of the applicator base material 120 after exposure to ultraviolet radiation at the first surface 122, and after selective exposure to ultraviolet radiation at the second surface 124. Preferably, the exposure at the first surface forms a substantially flat portion of polymerized resin 224. At the second surface, locations 225 exposed to radiation are polymerized such that polymerized resin extends from the second surface 124 to the first surface 122, which correspond to the radiation transparent portions 115 of the negative image. Other portions 227 along the second surface 124 at which there was no exposure to radiation, are left unpolymerized. The unpolymerized applicator base material 227 is then removed or separated by rinsing, and the structure dried and cured using infrared radiation to form a flexible, compressible, polymerized resin material.

Figure 3:
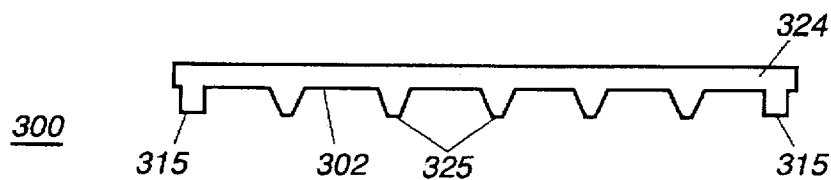
FIG. 3 is a side view of an applicator in accordance with the present invention.

FIG. 3 shows an applicator 300 formed by the process described above, in accordance with the present invention. Note that the applicator has a base portion 324 having a relatively flat surface and a front surface 302 patterned to form projections 325 that correspond in location to predetermined surface areas of a circuit substrate. The patterned surface is substantially planar and the projections 325 are flexible, pliant tips fixedly attached to the substantially planar surface. Preferably, the applicator 300 has locators 315, or fiducials defined on its surface to support alignment by an automated placement machine.

Figure 4:
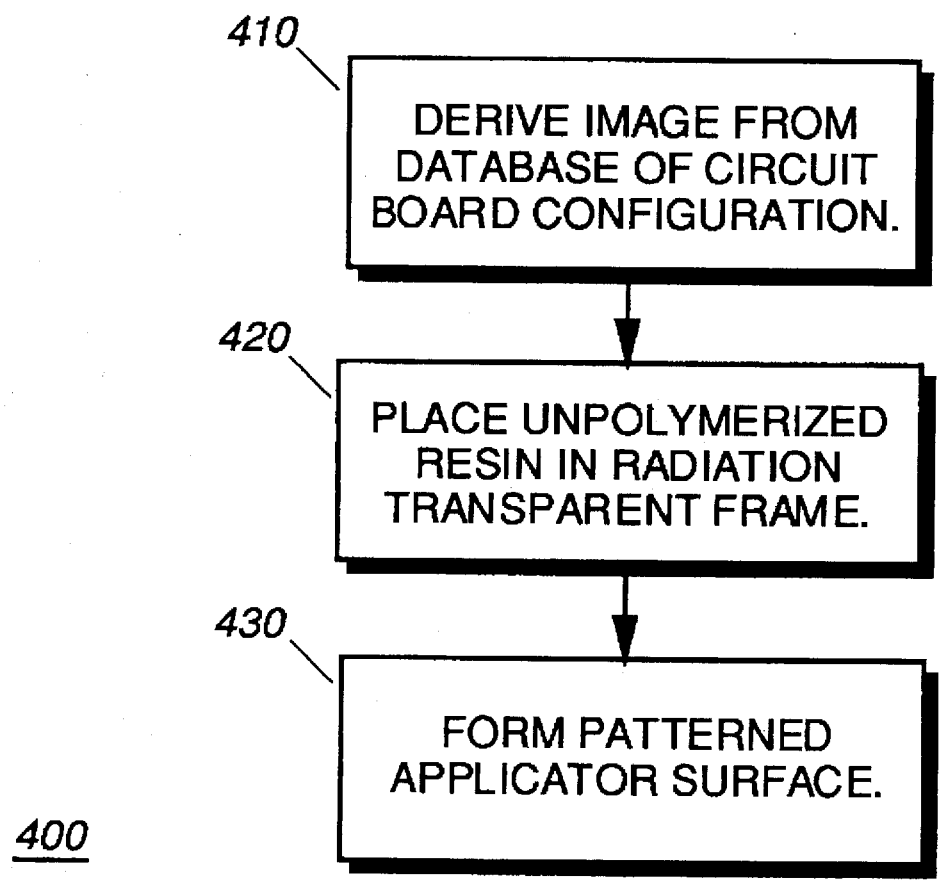
FIG. 4 is a flowchart of procedures to form the applicator of FIG. 3, in accordance with the present invention.

FIG. 4 is a flowchart 400 summarizing the procedures used to form the applicator 300 of the preferred embodiment, in accordance with the present invention. Information on the configuration of a particular circuit substrate is derived from a database and used to generate a photo-negative image that defines the size, shape, and location of features or projections on the applicator, for transferring tacky flux material, or other circuit substrate processing media, onto the particular circuit substrate, Step 410. Unpolymerized resin is then placed in a radiation transparent frame such that the resin has first and second opposing surfaces, Step 420. At least a portion of the applicator is formed by exposing the unpolymerized resin to radiation, using the negative image, to form an applicator surface patterned with projections that correspond to location to the surface areas of the circuit substrate, Step 430. Preferably, this is done by exposing a first surface of the unpolymerized resin to radiation to generate a flat portion of polymerized resin, and exposing the second surface to radiation through the negative image until portions of polymerized resin that correspond to the radiation transparent portions are formed that extend from the second surface to the first surface.

Figure 5:
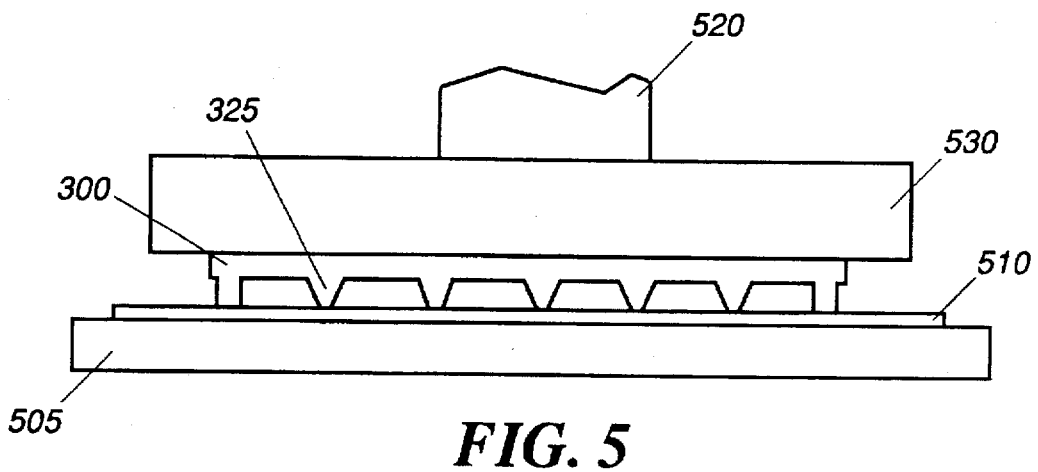
FIG. 5 shows the applicator of FIG. 3 being used to apply tacky flux material, in accordance with the present invention.
Figure 6:
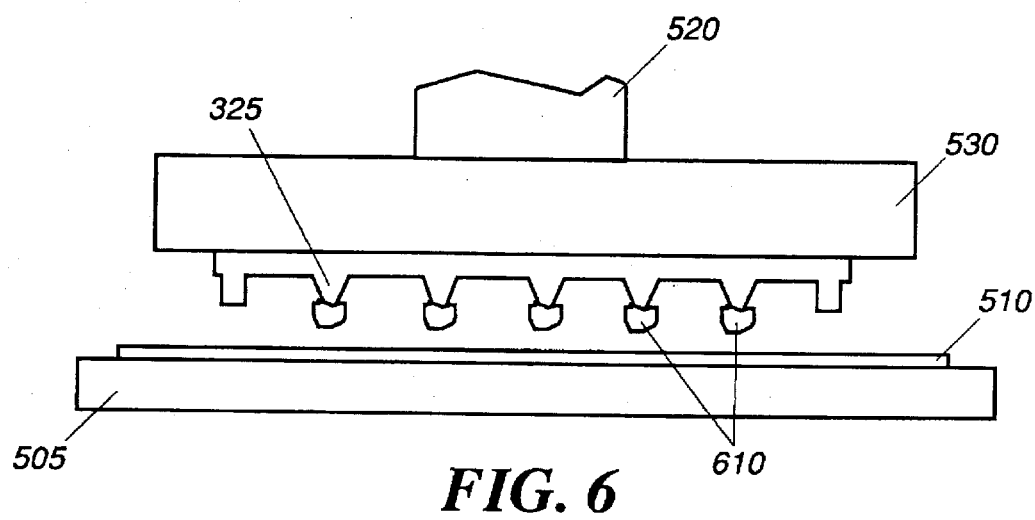
FIG. 6 shows the applicator with tacky flux material disposed thereon, in accordance with the present invention.
Figure 7:
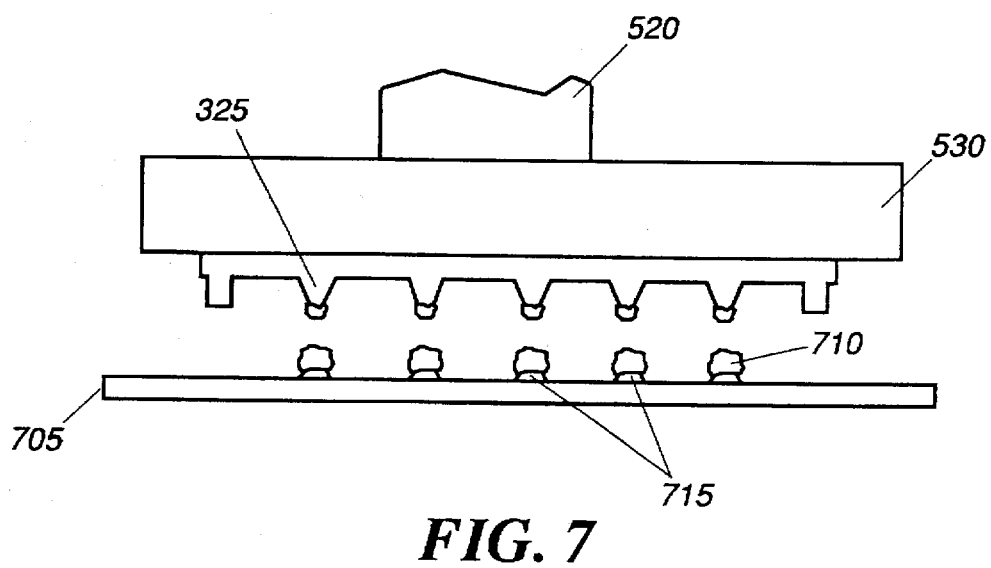
FIG. 7 shows the applicator depositing tacky flux material on a circuit board, in accordance with the present invention.

FIGS. 5, 6, and 7 show the applicator being used to deposit circuit substrate processing medium on a circuit substrate, in accordance with the present invention. Referring to FIG. 5, the applicator 300 is mechanically coupled, or fixedly attached, to a support base 530. The support base is attached to an automated placement machine 520, such as via a robotic arm. The applicator 300, support base 530, and automated placement machine 520, form part of a circuit substrate processing media deposition device. In the preferred embodiment, the applicator is used to transfer tacking agent 510 from a reservoir 505. The tacking agent is used as a fluxing agent and as a temporary adhesive to adhere circuit board components to specific areas on a circuit board substrate. The tacking agent may be as disclosed in U.S. Pat. No. 5,177,134, issued to Mullen III, et al. on Jan. 5, 1993, for A TACKING AGENT, and assigned to Motorola, Inc., which is hereby incorporated by reference. The tacking agent is maintained in reservoir 505 as a thin film 510 by a doctor blade as is common in the art. Referring to FIG. 6, the projections 325 of the applicator 300 engages the tacking agent, such that some of the tacking agent 610 adheres to the ends of the projections 325. Referring to FIG. 7, the applicator 300 is then located so as to engage a circuit substrate 705 such that tacking agent 710 is deposited at predetermined surface areas 715. The surface areas 715 of the preferred embodiment, correspond to cladded portions of the circuit substrate 705, i.e., areas where solder has been pre-deposited. As the projections are flexible and compressible, irregularities that may be present on the circuit substrate 705, or differences in heights of the cladded areas 715 are accommodated.

The present invention provides significant benefits over the prior art. The applicator tool 300 is simple and inexpensive to manufacture and yet provides fast and precise media transfer capabilities to facilitate the manufacture of electronic circuit substrates. Consequently, applicators may be replaced when clogged, rather than cleaned, thus avoiding a time-consuming and expensive operation. Moreover, the projections are resilient and flexible, and not as susceptible to damage when compared to pins used in pin transfer processes.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method for forming an applicator for applying tacking media to a circuit substrate, the method comprising the steps of:

forming a negative image defining radiation transparent portions that correspond to surface areas of a circuit substrate designated to receive tacking medium; and forming at least a portion of the applicator including the step of exposing unpolymerized resin to radiation, using the negative image, to form an applicator surface patterned with projections that correspond in location to the surface areas of the circuit substrate.

2. The method of claim 1, wherein the step of forming at least a portion of the applicator further comprises the steps of:

placing the unpolymerized resin in an ultra violet radiation transparent frame such that the unpolymerized resin has first and second surfaces;

exposing the first surface to ultra violet radiation; and exposing the second surface to ultra violet radiation using the negative image.

3. The method of claim 2, wherein the step of exposing the first surface comprises the step of flooding the first surface with ultra violet radiation to generate a flat portion of polymerized resin.

4. The method of claim 3, wherein the step of exposing the second surface comprises the step of radiating the unpolymerized resin from the second surface, using the negative image, until portions of polymerized resin, that correspond to the radiation transparent portions of the negative image, extends from the second surface to the first surface.

5. The method of claim 4, wherein after the step of radiating the unpolymerized resin from the second surface, the further step of removing unpolymerized resin from around the portions of polymerized resin.

6. A method for forming an applicator for applying tacking media to a circuit substrate, the method comprising the steps of:

forming a negative image substrate defining radiation transparent portions that correspond to surface areas of a circuit substrate designated to receive tacking medium;

placing unpolymerized resin in a radiation transparent frame such that the unpolymerized resin has first and second opposing surfaces;

exposing the first surface to radiation to generate a flat portion of polymerized resin;

exposing the second surface to radiation through the negative image substrate, until portions of polymerized resin, that correspond to the radiation transparent portions, are formed that extend from the second surface to the first surface; and removing unpolymerized resin from around the portions of polymerized resin to form an applicator surface patterned with projections that correspond in location to the surface areas of the circuit substrate.

7. The method of claim 6, wherein the step of placing unpolymerized resin comprises the step of placing an unpolymerized resin that becomes polymerized when exposed to ultra violet radiation.

8. The method of claim 7, wherein the steps of exposing comprise the step of exposing the resin to ultra violet radiation.

9. The method of claim 6, wherein the step of forming a negative image comprises the step of deriving data from a database describing portions of the circuit substrate.

* * * * *